(12) United States Patent
Rothenhoefer et al.

(10) Patent No.: US 10,025,203 B2
(45) Date of Patent: Jul. 17, 2018

(54) METHOD AND ARRANGEMENT FOR ACTUATING AN ELEMENT

(71) Applicant: Carl Zeiss SMT GmbH, Oberkochen (DE)

(72) Inventors: Gerald Rothenhoefer, Oberkochen (DE); Christian Kempter, Wittislingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/283,659

(22) Filed: Oct. 3, 2016

(65) Prior Publication Data

US 2017/0023869 A1    Jan. 26, 2017

Related U.S. Application Data

(63) Continuation of application No. PCT/EP2015/056290, filed on Mar. 24, 2015.

(30) Foreign Application Priority Data

Apr. 7, 2014  (DE) .................. 10 2014 206 686

(51) Int. Cl.
*G03B 27/54* (2006.01)
*G03F 7/20* (2006.01)
(Continued)

(52) U.S. Cl.
CPC ......... *G03F 7/70766* (2013.01); *G02B 7/181* (2013.01); *G02B 7/1828* (2013.01);
(Continued)

(58) Field of Classification Search
CPC .................. G03F 7/70825; G03F 7/70766
(Continued)

(56) References Cited

U.S. PATENT DOCUMENTS 6,472,777 B1   10/2002  Teng et al.
8,879,046 B2 * 11/2014  Aubele ............... G02B 7/005
                                                    355/67

(Continued)

FOREIGN PATENT DOCUMENTS

DE    10 2009 009 221 A1    8/2010
EP       1 457 833 A2        9/2004
(Continued)

OTHER PUBLICATIONS

International Preliminary Report on Patentability for corresponding PCT Appl No. PCT/EP2015/056290, dated Oct. 20, 2016.
(Continued)

*Primary Examiner* — Hung Henry Nguyen
(74) *Attorney, Agent, or Firm* — Fish & Richardson P.C.

(57) ABSTRACT

The disclosure relates to a method and an arrangement for actuating an element in a system for microlithography. According to an aspect in at least one degree of freedom an actuator force is exerted on the element via at least two actuator components. The actuator components are driven independently of one another for generating the actuator force. Driving is effected so that a thermal power introduced into the system on account of the generation of the actuator force by the actuator components deviates from a predefined constant value by not more than 20%.

19 Claims, 5 Drawing Sheets

(51) Int. Cl.
*G02B 7/182* (2006.01)
*G02B 7/18* (2006.01)

(52) U.S. Cl.
CPC ...... *G03F 7/70758* (2013.01); *G03F 7/70825* (2013.01); *G03F 7/70891* (2013.01)

(58) Field of Classification Search
USPC ........................ 355/52, 53, 67; 359/819–821
See application file for complete search history.

(56) References Cited

U.S. PATENT DOCUMENTS

| 2010/0149506 | A1* | 6/2010 | De Vries | G03F 7/70825 355/67 |
|---|---|---|---|---|
| 2011/0063063 | A1 | 3/2011 | Koops et al. | |
| 2011/0069293 | A1* | 3/2011 | Hol | G03F 7/70758 355/67 |
| 2011/0317140 | A1 | 12/2011 | Sigel et al. | |
| 2014/0078487 | A1 | 3/2014 | Aubele et al. | |

FOREIGN PATENT DOCUMENTS

| EP | 1 882 983 A1 | 1/2008 |
|---|---|---|
| WO | WO 2014/029678 | 2/2014 |

OTHER PUBLICATIONS

German Office Action, with translation thereof, for corresponding DE Appl No. 10 2014 206 686.7, dated Nov. 26, 2014.
International Search Report and Written Opinion for corresponding PCT Appl No. PCT/EP2015/056290, dated Sep. 15, 2015.

* cited by examiner

METHOD AND ARRANGEMENT FOR ACTUATING AN ELEMENT

CROSS REFERENCE TO RELATED APPLICATIONS

The present application is a continuation of, and claims benefit under 35 USC 120 to, international application PCT/EP2015/056290, filed Mar. 24, 2015, which claims benefit under 35 USC 119 of German Patent Application DE 10 2014 206 686.7 filed on Apr. 7, 2014. The content of these applications are hereby incorporated by reference.

FIELD

The disclosure relates to a method and an arrangement for actuating an element in a system for microlithography. The arrangement according to the disclosure is advantageously useable for example in an optical system, in particular a device for determining the position of structures on a mask or else in a microlithographic projection exposure apparatus (for example for actuating a mirror in an illumination unit or in a projection lens). The disclosure also advantageously useable in other systems, in particular in systems in which transient thermal loads lead to an impairment of the operating properties of the system and limiting the transient thermal loads is thus of major importance.

BACKGROUND

In systems in which the exact positioning of an element with particularly high accuracy and setting speed is desirable, such as for example and in particular in optical systems, the exact and fast positioning is often at odds with the applicable restrictions with regard to the maximum permissible thermal loads in the system.

In this case, the transient (i.e. arising in a non-constant manner, or non-steady-state) thermal loads—associated e.g. with an actuation at varying positioning speeds—can be particularly problematic, which loads, for instance by way of temporally variable mechanical deformations induced by them in the relevant element and/or some other structure within the system can result in impairments of the operating properties of the system, the impairments being dependent on the operation of the actuator.

Known approaches for overcoming the problems brought about by transient thermal loads include e.g. thermally isolating the component(s) bringing about the relevant thermal loads from the rest of the system, or implementing active or passive cooling strategies. However, such approaches lead to an increased constructional outlay and, moreover, also do not always ensure a sufficiently fast or exact elimination of the transient thermal loads arising.

SUMMARY OF THE DISCLOSURE

The present disclosure seeks to provide a method and an arrangement for actuating an element in a system for microlithography which enable exact and fast positioning whilst at least substantially avoiding the problems brought about by transient thermal loads.

In one aspect, the disclosure provides a method for actuating an element in a system for microlithography,
in at least one degree of freedom an actuator force is exerted on the element via at least two actuator components;
wherein the actuator components are driven independently of one another for generating the actuator force; and
wherein the driving is effected in such a way that a thermal power introduced into the system on account of the generation of the actuator force by the actuator components deviates from a predefined constant value by not more than 20%.

The disclosure is based on the concept, in particular, in the course of actuating an element in a system, of reducing or even completely eliminating the introduction of transient thermal loads into the system by virtue of the fact that an increased constant thermal load (which can also be designated as "nominal thermal load") is accepted by way of the predefinition of a constant value for the thermal power introduced into the system on account of the actuation, and by virtue of the fact that the actuator components are driven with permanent generation of the thermal power. This approach also proceeds from the consideration that regardless of a thermal load that is possibly increased but arises in a constant fashion in the process, the system can be operated at thermal equilibrium and in this respect, in particular, undesirable deformations that impair the operating properties (e.g. the optical properties of a microlithographic projection exposure apparatus that react particularly sensitively to such deformations) no longer take place.

In this case, the criterion according to which the thermal power introduced into the system by the actuator components deviates from the predefined constant value by not more than 20% is intended to express the fact that the disclosure should be deemed also already to encompass scenarios in which the constant value predefined for the thermal power introduced into the system is not always complied with exactly wherein, if appropriate, the occasional generation of transient loads can also still be afforded tolerance to a certain extent, depending on the predefined value of the thermal power.

In accordance with one embodiment, the driving of the actuator components is effected in such a way that a thermal power introduced into the system on account of the generation of the actuator force by the actuator components deviates from the predefined constant value by not more than 10%, in particular by not more than 5%.

In accordance with one embodiment, the predefined constant value for the thermal power introduced into the system by the actuator components is chosen in such a way that the thermal power corresponds to the thermal power introduced into the system upon generation of the maximum permissible actuator force by the actuator components.

In accordance with one embodiment, the actuator components are coils to which electric current is applied for generating the actuator force.

In accordance with one embodiment, the driving of the actuator components is effected at least occasionally such that the actuator components at least partly cancel one another out with regard to their contribution to the actuator force exerted on the element.

The disclosure also relates to a method for actuating an element in a system for microlithography,
wherein in at least one degree of freedom an actuator force is exerted on the element via of at least two actuator components;
wherein the actuator components are driven independently of one another for generating the actuator force; and
wherein that the driving is effected at least occasionally such that the actuator components at least partly cancel one another out with regard to their contribution to the actuator force exerted on the element.

In accordance with one embodiment, the actuator components at least occasionally generate force components that counteract one another.

The disclosure also relates to a method for actuating an element in a system for microlithography,
wherein in at least one degree of freedom an actuator force is exerted on the element via at least two actuator components;
wherein the actuator components are driven independently of one another for generating the actuator force; and
wherein the actuator components at least occasionally generate force components that counteract one another.

In accordance with one embodiment, the actuator force is adjusted in amount and/or direction by varying the force components (in amount and/or direction).

In accordance with one embodiment, the actuator components are coils, wherein an electric current being applied to each of the coils, respectively, is at least occasionally varied (in amperage and/or current flow direction) in order to vary the force components.

In accordance with one embodiment, the driving of the actuator components is effected at least occasionally such that the thermal power introduced into the system by the actuator components at least partly compensates for a thermal disturbance present in the system, in particular on account of a heat source present elsewhere in the system.

In accordance with one embodiment, the system is an optical system.

The disclosure further also relates to an arrangement for actuating an element in a system for microlithography, wherein in at least one degree of freedom an actuator force on the element is generatable via at least two actuator components, wherein the actuator components are driveable independently of one another for generating the actuator force, and wherein the driving is effected in such a way that a thermal power introduced into the system on account of the generation of the actuator force by the actuator components deviates from a predefined value by not more than 20%.

The disclosure further also relates to an arrangement for actuating an element in a system for microlithography, wherein in at least one degree of freedom an actuator force on the element is generatable via at least two actuator components, wherein the actuator components are driveable independently of one another for generating the actuator force, and wherein the driving is effected at least occasionally such that the actuator components at least partly cancel one another out with regard to their contribution to the actuator force exerted on the element.

The disclosure further also relates to an arrangement for actuating an element in a system for microlithography, wherein in at least one degree of freedom an actuator force on the element is generatable via at least two actuator components, wherein the actuator components are driveable independently of one another for generating the actuator force, and wherein the actuator components at least occasionally generate force components that counteract one another.

The disclosure further also relates to an optical system including an arrangement having the features described above, in particular a system for microlithography, such as e.g. a device for determining the position of structures on a mask or an optical system of a microlithographic projection exposure apparatus.

Further configurations of the disclosure can be gathered from the description and the dependent claims.

The disclosure is explained in greater detail below on the basis of exemplary embodiments illustrated in the accompanying figures.

DETAILED DESCRIPTION OF PREFERRED EMBODIMENTS

Figure 1:
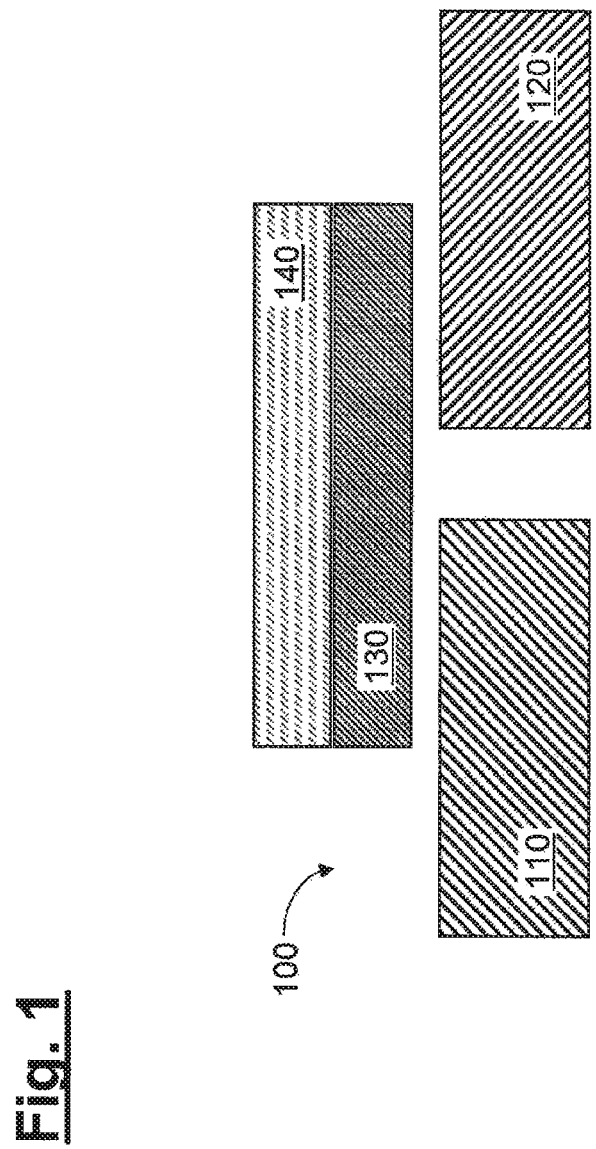
FIG. 1 shows a basic schematic diagram for elucidating one possible construction of an actuating arrangement with which the method according to the disclosure is realizable.

FIG. 1 firstly shows a basic schematic diagram for elucidating one possible construction of an arrangement for actuating an element in a system, in which arrangement the method according to the disclosure is realizable.

In accordance with FIG. 1, an actuator arrangement 100 for actuating an element 140—which, merely by way of example, can be an optical element (e.g. a mirror or a lens element) in an optical system—includes a first coil 110, a second coil 120 and a permanent magnet 130. An electric current $i_1$ and $i_2$ can respectively be applied to the coils 110, 120 independently of one another, with the consequence that the respective coil 110, 120 in a given degree of freedom respectively exerts a force $F_1$ and $F_2$ on the permanent magnet 130 or the element 140 mechanically coupled to the permanent magnet 130.

For the power introduced overall into the system by the coils 110, 120 owing to the application of current, which power hereinafter is also designated "dissipated power" $P_{diss}$, the following then holds true:

$$P_{diss.}=R_1 i_1^2+R_2 i_2^2 \qquad (1)$$

For the force F exerted overall on the element 140 by the coils 110, 120 the following holds true:

$$F=k_1 i_1+k_2 i_2 \qquad (2)$$

In equations (1) and (2) above, $R_1$ and $R_2$ denote the electrical resistances of the coils 110, 120, and $k_1$ and $k_2$ denote the motor constants (or actuator constants) of the actuator component respectively formed by the relevant coil 110, 120 with the permanent magnet 130. In general, both the motor constants $k_1$ and $k_2$ and the electrical resistances of the coils 110, 120 are temperature-dependent, wherein the motor constants $k_1$ and $k_2$ additionally have a position dependence (in the sense of a dependence on the present position of the actuated element 140 or of the permanent magnet 130). These dependencies, which will initially be disregarded in the following consideration, will be discussed in still greater detail.

In accordance with one aspect of the present disclosure, then, the electric currents $i_1$ and $i_2$ respectively applied to the coils 110, 120 are chosen (i.e. the coils 110, 120 are driven), in such a way that the transient thermal loads brought about by this application of current in the system are reduced or even completely eliminated, if appropriate an increased constant thermal load ("nominal thermal load") being accepted.

In accordance with one embodiment, in order to ascertain the electric currents $i_1$ and $i_2$, respectively, the dissipated power $P_{diss}$ in equation (1) is predefined in such a way that it corresponds to the power $P_{max}$ for generating the maximum permissible force $F_{max}$ of the actuator arrangement 100. In this case, the maximum force $F_{max}$ of the actuator arrangement 100 corresponds to that force at which, during continuous operation or else upon a specific operating period being exceeded, a failure of the actuator arrangement 100 occurs for instance owing to the coils 110, 120 "burning away".

Solving the above-mentioned equation system including equations (1) and (2) yields:

$$i_1 = \frac{F}{k_1} \mp \frac{k_2\left(k_1\sqrt{-R_1R_2F^2 + P_{max}R_2k_1^2 + P_{max}R_1k_2^2} \pm FR_1k_2\right)}{(R_2k_1^2 + R_1k_2^2)k_1} \quad (3)$$

$$i_2 = \pm \frac{k_1\sqrt{-R_1R_2F^2 + P_{max}R_2k_1^2 + P_{max}R_1k_2^2} \pm FR_1k_2}{R_2k_1^2 + R_1k_2^2} \quad (4)$$

The requirement that the equation system including (3) and (4) has real (and not just imaginary) solutions, that is to say that the respective root term is greater than zero, yields a limitation of the exerted actuator force as follows:

$$F^2 \leq \frac{P_{max}R_2k_1^2 + P_{max}R_1k_2^2}{R_1R_2} \quad (5)$$

from which the following maximum value and minimum value for the force generated by the actuator arrangement 100 are obtained:

$$F_{max} = \sqrt{\frac{P_{max}R_2k_1^2 + P_{max}R_1k_2^2}{R_1R_2}} \quad (6)$$

$$F_{min} = -\sqrt{\frac{P_{max}R_2k_1^2 + P_{max}R_1k_2^2}{R_1R_2}} \quad (7)$$

Provided that no force outside the above limit values is provided by the actuator arrangement 100, then, the relevant force can be exerted completely without generation of transient thermal loads in the system.

In accordance with the approach described above, the actuator arrangement 100 introduces the maximum power $P_{max}$ (corresponding to the maximum thermal load) into the system at any time or permanently, wherein the maximum power $P_{max}$ corresponds to that power for generating the maximum permissible actuator force $F_{max}$ mentioned above. This has the consequence that in operating phases which call for a lower force in comparison with the maximum permissible actuator force $F_{max}$, the coils 110, 120 at least partly "work against one another", that is to say that, for example, the first coil 110 exerts a force on the element 140 towards the left whereas the second coil 120 exerts a force on the element 140 towards the right), the requisite additional portions (i.e. which cancel one another out in terms of their effect with regard to the respective force components) of the electric currents $i_1$ and $i_2$ being used for generating heat. This additionally generated heat serves in turn to avoid transient thermal loads, for which purpose an increased level of the constant thermal load introduced into the system is accepted according to the disclosure.

In this regard, for instance in a simple example in an operating phase that demands the exertion of an actuator force on the element 140 amounting to half the maximum actuator force $F_{max}$ the currents $i_1$ and $i_2$ can be chosen in such a way that the first coil 110 generates a force $F_1=0.75*F_{max}$ and the second coil 120 generates a force $F_2=-0.25*F_{max}$, wherein the current portions cancelling one another out with regard to their force action in the coils 110, 120 serve solely for generating heat in order that the thermal load introduced into the system is kept constant, as described above.

The disclosure in this case makes use of the fact that, on account of the at least two coils 110, 120 which are present in the actuator arrangement 100 per degree of freedom and to which electric current can be applied independently of one another, there are different possibilities for generating a specific desired force on the respective element 100, wherein these possibilities differ from one another with regard to the application of current to the coils 110, 120. This application of current to the coils 110, 120 or the driving thereof, is then effected according to the disclosure in the above-described approach in such a way that although the thermal load introduced overall into the system is possibly increased (i.e. more thermal load is introduced than would be necessary per se for generating the actuator force), in return as constant a thermal load as possible is maintained (or at least a reduction of the transient portion of the thermal load introduced overall into the system is obtained).

The disclosure is not restricted to the above-described power for generating the maximum power $P_{max}$ (corresponding to the power for generating the maximum permissible force $F_{max}$ of the actuator arrangement 100). In further embodiments, a power less than the above maximum power $P_{max}$ can also be predefined (that is to say corresponding to a force which is less than the maximum permissible force $F_{max}$ of the actuator arrangement 100). In this case, a complete elimination of transient thermal loads is possible only up to a threshold value of the generated force (i.e. only with the generation of a limited actuator force). Upon the threshold being exceeded, transient thermal loads are generated. However, the transient thermal loads are still lower than the transient thermal loads which would be generated in the case of conventional driving of the coils 110, 120 entirely without the predefinition of a constant dissipated power $P_{diss}$ or without current being applied to the coils 110, 120 in a manner at least partly cancelling one another out with regard to the force action thereof.

In general, for the dissipated power $P_{diss}$ introduced into the system by the actuator arrangement 100, it is also possible to predefine an arbitrary value which is less than the maximum permissible power $P_{max}$ (at which a failure of the actuator arrangement 100 occurs e.g. owing to the coils 110, 120 "burning away"), although the power $P_{diss}$ is greater than the minimum power for generating a desired force. With corresponding predefinition of the dissipated power $P_{diss}$ introduced into the system, the equation system corresponding to equations (3), (4) has real solutions. If, as described above, the value of the dissipated power $P_{diss}$ introduced into the system is set to the maximum permissible power $P_{max}$, the maximum permissible force $F_{max}$ can be generated.

In accordance with a further aspect of the disclosure, the above-described predefinition of a power to be dissipated by the application of current to the coils 110, 120 can also be effected in order to introduce heat into the system in a targeted manner, wherein the heat can serve for taking account of or compensating for a thermal disturbance present in the system (e.g. owing to other heat sources in the system). In other words, the actuator arrangement 100 according to the disclosure can also be used in a targeted manner as heating, in order in this way to influence properties of the system and to compensate, via control engineering, for thermal disturbance sources in the system, for instance, without the requirement for an additional heating.

In this case, the concept according to the disclosure can be used to generate the heat for the compensation "force-neutrally" in so far as the actuator force on the element 140 is provided by the actuator arrangement 100 in each case without being altered. In contrast to the above-described approach of reducing transient thermal loads, the heat additionally arising during the operation of the actuator arrangement 100 is however not merely accepted here (and e.g. dissipated via a suitable cooling unit), but rather constitutes precisely a purposefully set variable used e.g. to compensate for a thermal disturbance generated elsewhere.

Figure 2:
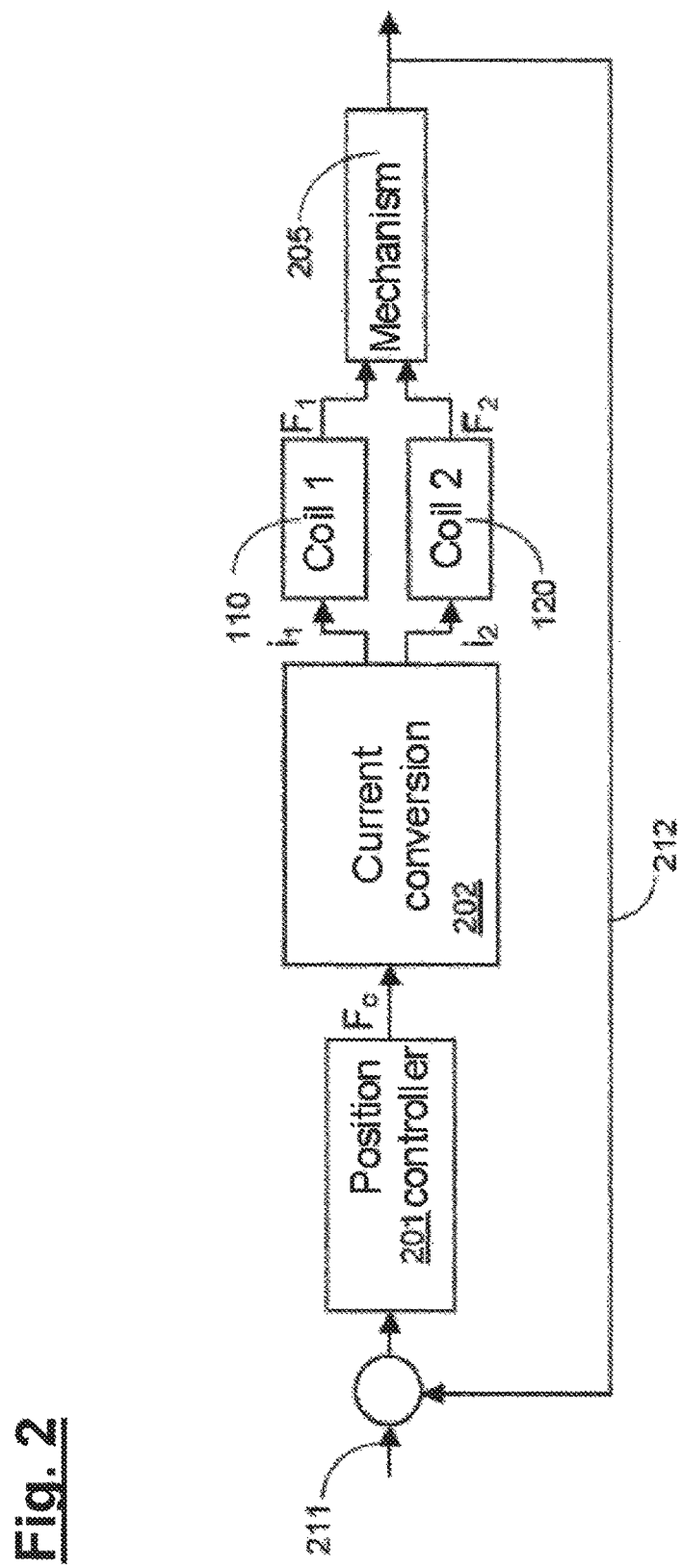
FIG. 2 shows a control diagram for elucidating one possible embodiment of the method according to the disclosure.

FIG. 2 shows a control diagram for elucidating a control that is possible according to the disclosure. A desired position 211 of the element 100 that is to be controlled in terms of its position is predefined as setpoint variable. The difference between the desired position 211 and an actual position 212 of the element 100, the actual position being ascertained in a sensor-aided manner, is fed to a position controller 201, which calculates the force F to be applied by the actuator arrangement 100. This force corresponds to a necessary current from which the values of the currents $i_1$ and $i_2$ which are applied to the coils 110, 120 are calculated in turn in a unit 202 (with the realization of the concept according to the disclosure of predefining a specific constant power $P_{diss}$ to be introduced into the system) with knowledge of the motor constants $k_1$ $k_2$, $R_1$ and $R_2$. If the forces $F_1$ and $F_2$ respectively generated in accordance with this driving of the coils 110, 120 or application of current thereto are of the same sign, both forces $F_1$ and $F_2$ act completely on a mechanism 205 that carries the element 140 in an actuatable manner (i.e. are used for the positioning of the element 140) where e.g. the maximum actuator force $F_{max}$ can be set. However, if the maximum actuator force $F_{max}$ on the element 140 is not required e.g. in an operating phase, e.g. the force contribution $F_1$ generated by the first coil 110 has a negative value and the force contribution $F_2$ generated by the second coil 120 has a positive value (or vice versa). Consequently, the coils 110, 120 partly work against one another, wherein only the difference force $\Delta F=F_1-F_2$ influences the mechanism 205 or the positioning of the element 140, while the portions of the currents $i_1$ and $i_2$ that compensate for one another with regard to their force action on the element 140 serve only for the generation of heat (for the purpose of partly or completely eliminating transient thermal loads).

Overall, therefore, in accordance with FIG. 2, the currents $i_1$ and $i_2$ in the coils 110, 120 are controlled in such a way that a desired force is exerted by the actuator arrangement 100 with the introduction of a predefined power $P_{diss}$ into the system.

Figure 3:
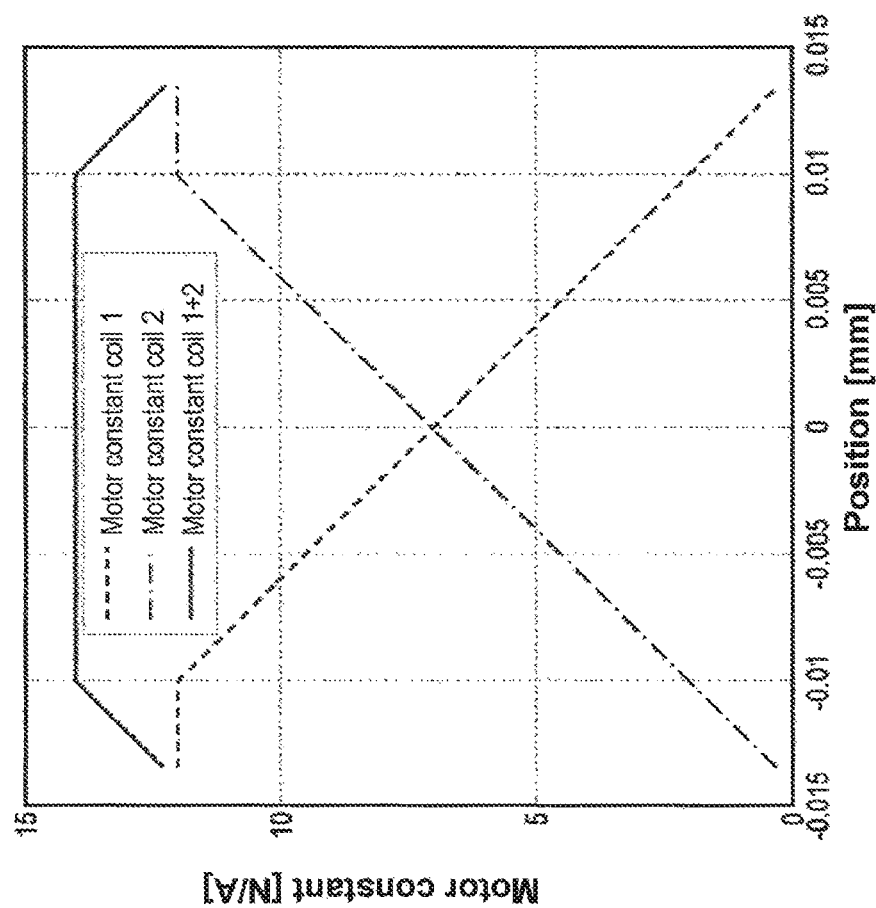
FIGS. 3-5 show diagrams for elucidating the consideration—possible in embodiments of the disclosure—of position dependencies of the motor constants in an actuating arrangement according to the disclosure.

As has already been mentioned and is illustrated by way of example in FIG. 3, generally the motor contains $k_1$, $k_2$ are not position-independent, but rather have a position dependence with regard to the present position of the actuated element 140 or of the permanent magnet 130. FIG. 3 shows merely by way of example a regionally linear position dependence (between a position of −0.01 mm and a position of +0.01 mm), wherein the sum of the two motor constants $k_1$, $k_2$ is furthermore constant in this example. Given a known characteristic e.g. in accordance with FIG. 3, it is possible to take account of the position dependence via a correspondingly modified setting of the currents $i_1$, $i_2$, i.e. driving of the coils 110, 120, by solving the above equation system for each position of the element 140 (which is generally measured anyway during the operation of the system).

Furthermore, it is possible to take account of thermal influences both on the motor contains $k_1$, $k_2$ and on the electrical resistances $R_1$ and $R_2$ (for instance in the case where the generation of transient thermal loads is partly allowed in a manner that is possible as described above), in each case by measuring the temperature and solving the above equation system for each position and each temperature. Taking account of the temperature dependence of the electrical resistances $R_1$ and $R_2$ and the motor constants $k_1$ and $k_2$ is dispensable, however, if transient thermal loads are completely eliminated in accordance with the first-described approach, since then the system is permanently in thermal equilibrium.

Figure 4:
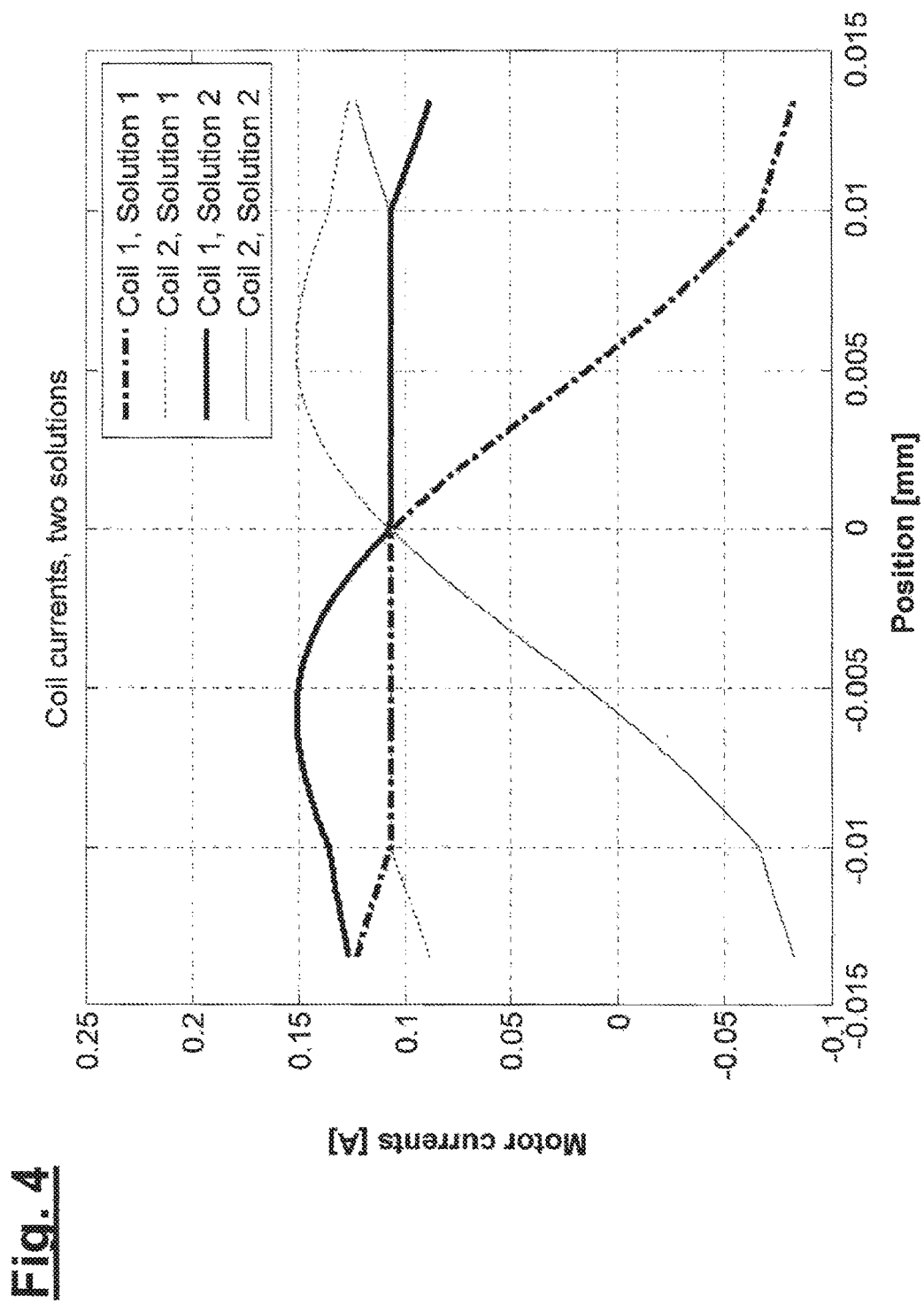

In accordance with FIG. 4, different currents $i_1$, $i_2$ arise for the different positions during the driving of the coils 110, 120, the currents being in each case for generating a constant power $P_{diss}$ introduced into the system. The diagram from FIG. 4 is applicable here merely by way of example for the position dependence described above with reference to FIG. 3 (other profiles arising, of course, in the case of different position dependence).

Figure 5:
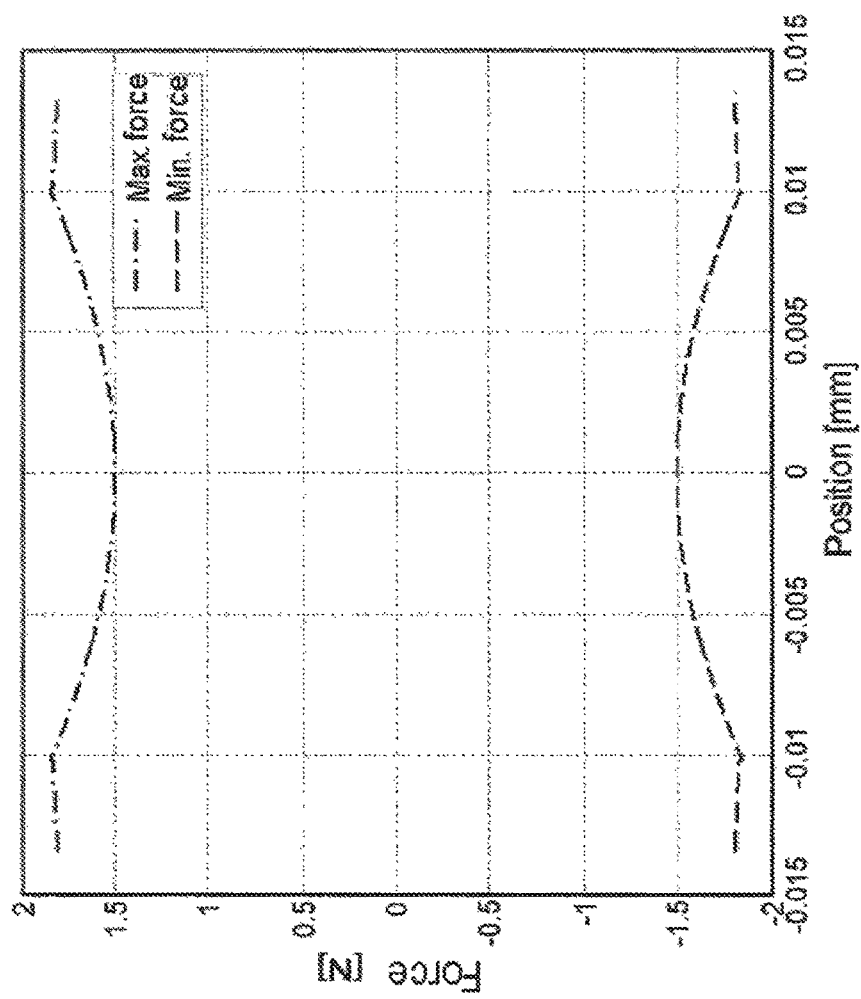

As is shown in the diagram from FIG. 5 for the above example of the position dependence of the motor constants $k_1$ and $k_2$, position-dependent limits arise for the achievable maximum force and the achievable minimum force. In the implementation, in each case the narrowest limit (in the example corresponding to a range of values of the permissible force between −1.5 N and +1.5 N) can be taken as a basis or a position-dependent limit value for the force can be taken as a basis with the consequence that at no point in time does the position controller 201 from FIG. 2 request a force that exceeds the force permissible for the relevant position.

As soon as the root term in the equation system including equations (3) and (4) is no longer positive, either the higher force demanded by the position controller 201 from FIG. 2 cannot be provided or the power $P_{diss}$ rises with the consequence of generation of transient thermal loads. In the implementation, a possible momentary higher power in comparison with the predefined power $P_{diss}$ can furthermore be allowed (wherein a fault message can be generated in this case e.g. after a predefined time period (e.g. of 1 to 2 minutes) has been exceeded).

Even though the disclosure has been described on the basis of specific embodiments, numerous variations and alternative embodiments are evident to the person skilled in the art, e.g. by combination and/or exchange of features of individual embodiments. Accordingly, it goes without saying to the person skilled in the art that such variations and alternative embodiments are concomitantly encompassed by the present disclosure, and the scope of the disclosure is restricted only within the meaning of the appended patent claims and the equivalents thereof.

What is claimed is:

1. A method of actuating an optical element in a microlithography system, the optical element being coupled to a magnet, the method comprising:
determining a desired position of the optical element; and based on the desired position of the optical element, applying electric current to first and second coils independently of each other so that so that the first coil exerts a first force on the magnet and the second coil exerts a second force on the magnet, thereby causing the magnet to exert a force on the optical element in at least one degree of freedom first and second forces counteract each other.

2. The method of claim 1, wherein the electric current is applied to the first and second coils so that a thermal power introduced into the microlithography system due to the generation of the first and second forces deviates from a predefined constant value by not more than 10%.

3. The method of claim 1, wherein the electric current is applied to the first and second coils so that a thermal power introduced into the microlithography system due to the generation of the first and second forces deviates from a predefined constant value by not more than 20%.

4. The method of claim 3, comprising selecting the predefined constant value for the thermal power so that the thermal power corresponds to a thermal power introduced into the system upon generation of a maximum permissible value for the first force and a maximum permissible value for the second force.

5. The method of claim 1, wherein the first and second forces at least partly cancel out each other with respect to their contribution to a total force exerted on the magnet.

6. The method of claim 1, comprising varying the first and second forces in amount and/or direction.

7. The method of claim 1, further comprising varying the electric current to vary the first and second forces.

8. The method of claim 1, wherein the first and second forces at least partially compensate for a thermal disturbance in the microlithography system.

9. The method of claim 1, wherein the microlithography system is an optical microlithography system.

10. An arrangement, comprising:
a first coil;
a second coil;
a magnet;
an optical element coupled with the magnet;
a position controller configured to determine an actual position of the optical element; and
a current conversion unit,
wherein the arrangement is configured so that, when an electric current is applied to the first and second coils independently of each other, the first coil exerts a first force on the magnet and the second coil exerts a second force on the magnet, thereby causing the magnet to exert a force on the optical element in at least one degree of freedom,
wherein the first and second forces counteract each other with respect to their contribution to the force applied to the magnet, and
wherein the position controller is configured to provide a signal to the current conversion unit based on the actual position of the optical element.

11. The arrangement of claim 10, wherein the first and second coils are configured to have the electric current applied thereto independently so that the first and second forces at least partially cancel each other out.

12. An optical system, comprising:
an arrangement according to claim 10.

13. The optical system of claim 12, wherein the optical system is a device configured to determine a position of structures on a mask or to determine a position an optical system of a microlithographic projection exposure apparatus.

14. The method of claim 1, wherein the magnet comprises a permanent magnet.

15. The method of claim 1, further comprising determining a difference between an actual position of the optical element and the desired position of the optical element, and applying the electric current to the first and second coils based on the difference between the actual position of the optical element and the desired position of the optical element.

16. The arrangement of claim 10, wherein the magnet comprises a permanent magnet.

17. The optical system of claim 12, wherein the optical system comprises an illumination unit or a projection lens.

18. A method of actuating an optical element in a microlithography system, the method comprising:
determining a desired position of the optical element; and
based on the desired position of the optical element, applying electric current to first and second coils independently of each other so that the first coil exerts a first force on a magnet and the second coil exerts a second force on the magnet, thereby causing the magnet to exert a force on the optical element in at least one degree of freedom wherein the first and second forces counteract each other.

19. The method of claim 18, further comprising determining a difference between an actual position of the optical element and the desired position of the optical element, and applying the electric current to the first and second coils based on the difference between the actual position of the optical element and the desired position of the optical element.

* * * * *

UNITED STATES PATENT AND TRADEMARK OFFICE
CERTIFICATE OF CORRECTION

PATENT NO. : 10,025,203 B2
APPLICATION NO. : 15/283659
DATED : July 17, 2018
INVENTOR(S) : Gerald Rothenhoefer and Christian Kempter Page 1 of 1

It is certified that error appears in the above-identified patent and that said Letters Patent is hereby corrected as shown below:

In the Specification

Column 7, Line 37, delete "$k_1 \; k_2$," and insert -- $k_1, k_2,$ --.

Column 7, Line 62, delete "contains" and insert -- constants --.

Column 8, Line 11, delete "contains" and insert -- constants --.

In the Claims

Column 9, Claim 1, Line 3, after "so that" delete "so that".

Column 9, Claim 1, Line 7, after "freedom" insert -- wherein the --.

Signed and Sealed this
Twenty-third Day of April, 2019

Andrei Iancu
*Director of the United States Patent and Trademark Office*